United States Patent
Tamai

(10) Patent No.: US 7,984,343 B2
(45) Date of Patent: Jul. 19, 2011

(54) INTER-DEVICE CONNECTION TEST CIRCUIT GENERATING METHOD, GENERATION APPARATUS, AND ITS STORAGE MEDIUM

(75) Inventor: Kohichi Tamai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 109 days.

(21) Appl. No.: 12/538,460

(22) Filed: Aug. 10, 2009

(65) Prior Publication Data

US 2009/0295403 A1    Dec. 3, 2009

Related U.S. Application Data

(63) Continuation of application No. PCT/JP2007/000230, filed on Mar. 15, 2007.

(51) Int. Cl.
*G01R 31/28* (2006.01)
(52) U.S. Cl. .......... 714/712; 714/25; 714/724; 714/713; 714/716; 714/727; 714/734; 714/725; 714/733; 716/101; 716/100; 716/103; 716/104; 716/116; 716/117; 716/121; 716/126; 716/128; 716/136; 716/137
(58) Field of Classification Search .................. None
See application file for complete search history.

(56) References Cited

U.S. PATENT DOCUMENTS

| | | | |
|---|---|---|---|
| 6,347,387 B1 * | 2/2002 | Fischer | 714/738 |
| 6,678,645 B1 * | 1/2004 | Rajsuman et al. | 703/20 |
| 7,730,435 B2 * | 6/2010 | Pritchard et al. | 716/136 |

FOREIGN PATENT DOCUMENTS

| | | | |
|---|---|---|---|
| JP | 7-174821 | | 7/1995 |
| JP | 11-023667 | | 1/1999 |
| JP | 11-44741 | | 2/1999 |
| JP | 2000-121696 | * | 4/2000 |
| JP | 2004-151061 | * | 5/2004 |
| JP | 2005-283205 | | 10/2005 |

OTHER PUBLICATIONS

International Search Report for PCT/JP2007/000230, mailed Jun. 19, 2007.

* cited by examiner

*Primary Examiner* — John P Trimmings
(74) *Attorney, Agent, or Firm* — Fujitsu Patent Center

(57) ABSTRACT

A test circuit can use a simple test pattern data without customization for each substrate and considerably reduce a test preparation process. A connection test circuit is generated by receiving the input of the data of the connection relation indicating the devices mutually line-connected among a plurality of devices, the number of connection lines corresponding to the respective connection relations, and the device outputting a test result, sequentially searching for a connection destination device from the output terminal of an output device, and embedding a test circuit module in a test route.

14 Claims, 16 Drawing Sheets

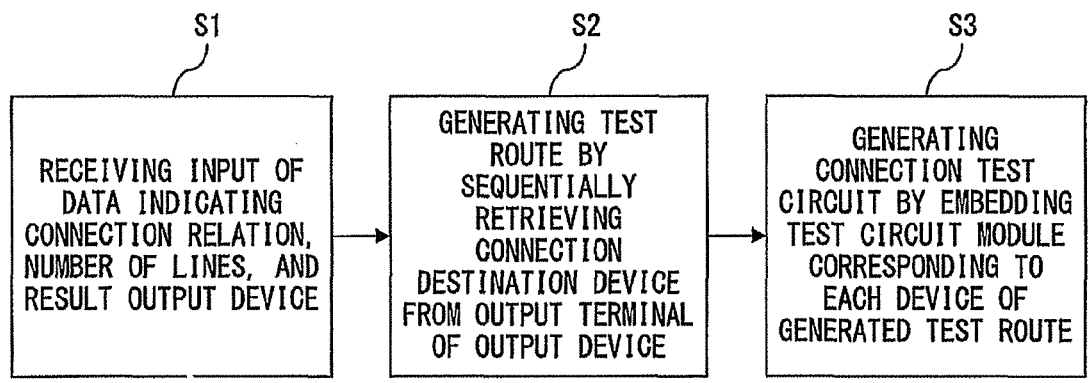
F I G. 1

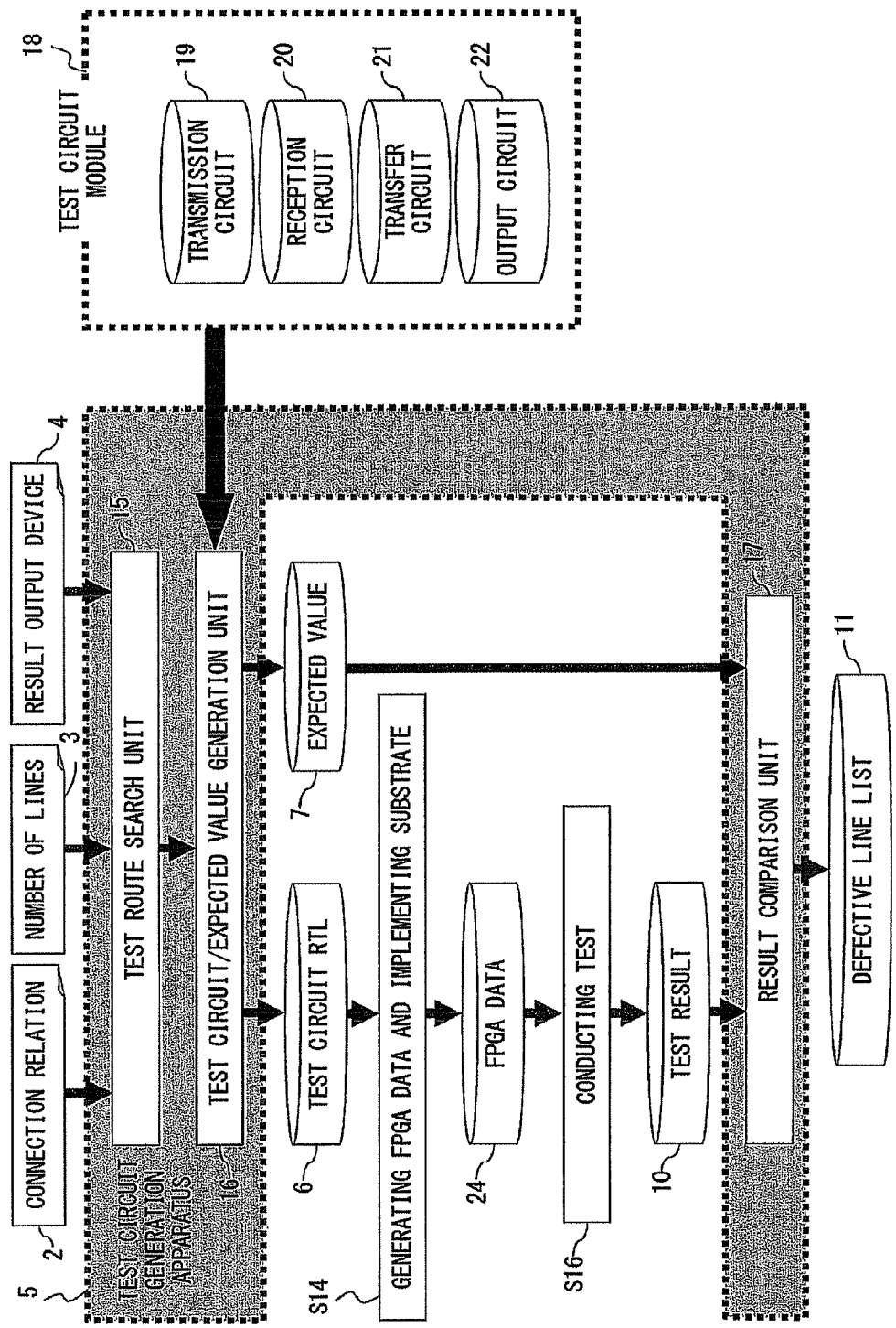
F I G. 3

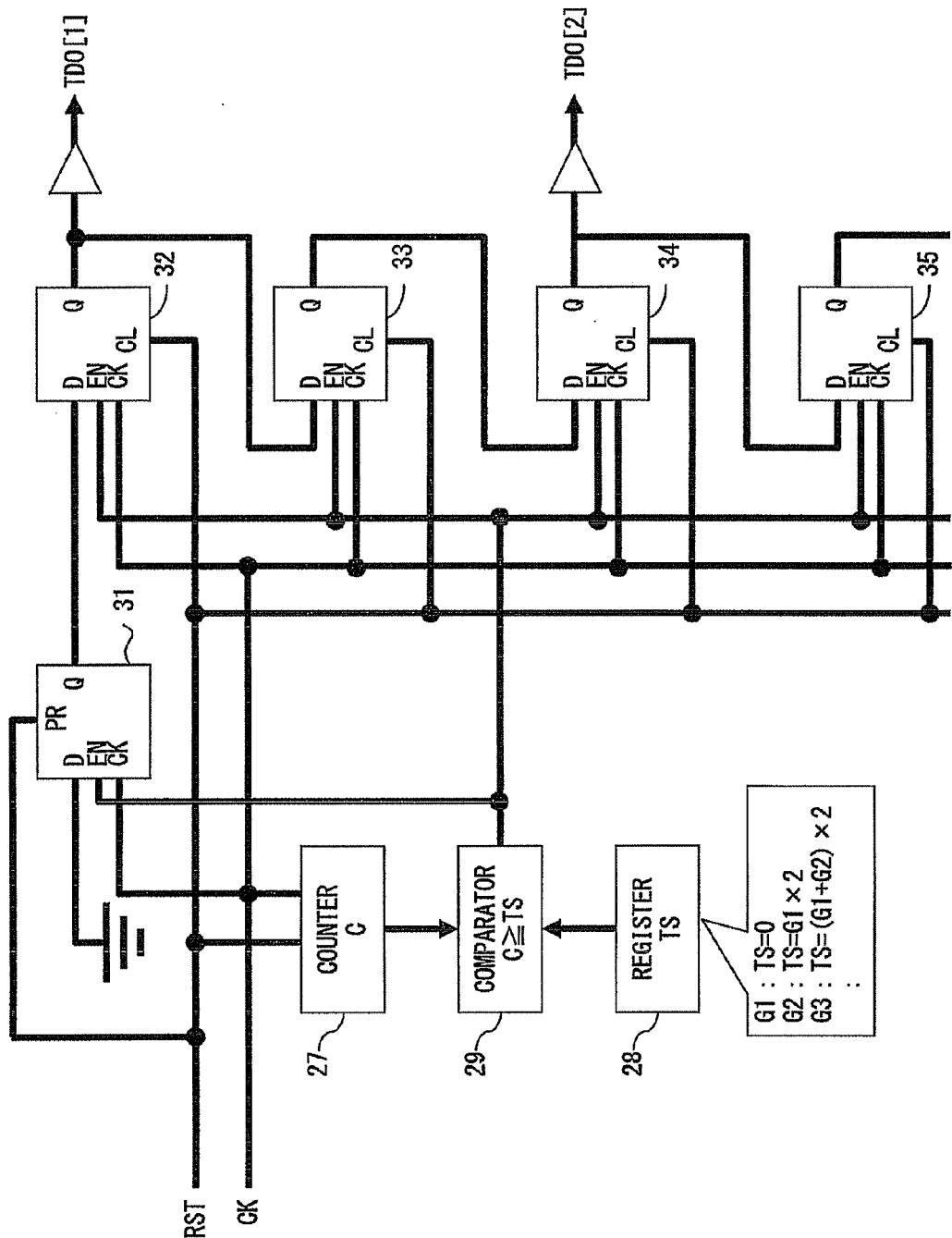
F I G. 6

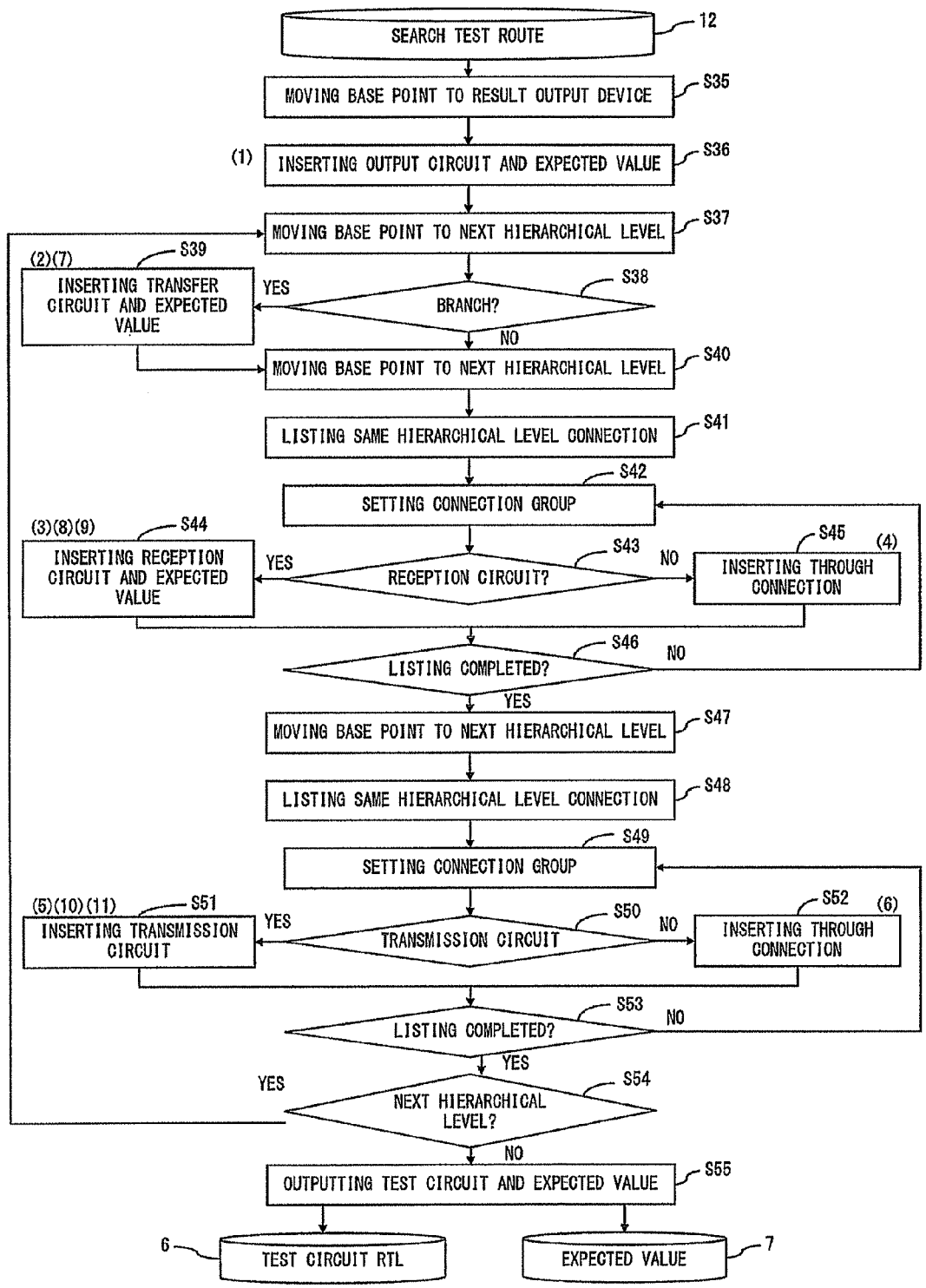
F I G. 11

```
ROUTE
OT        // FOR NUMBER OF OUTPUT CIRCUITS
FW        // FOR NUMBER OF TRANSFER CIRCUITS
G1   10   // FOR NUMBER OF G1 TESTS
FW        // FOR NUMBER OF TRANSFER CIRCUITS
G2   20   // FOR NUMBER OF G2 TESTS
G3   30   // FOR NUMBER OF G3 TESTS
ENDROUTE

PATTERN
01
01
0101010101010101010101
01
010101010101010101010101010101010101
01010101010101010101010101010101010101010101010101010101
ENDPATTERN
```

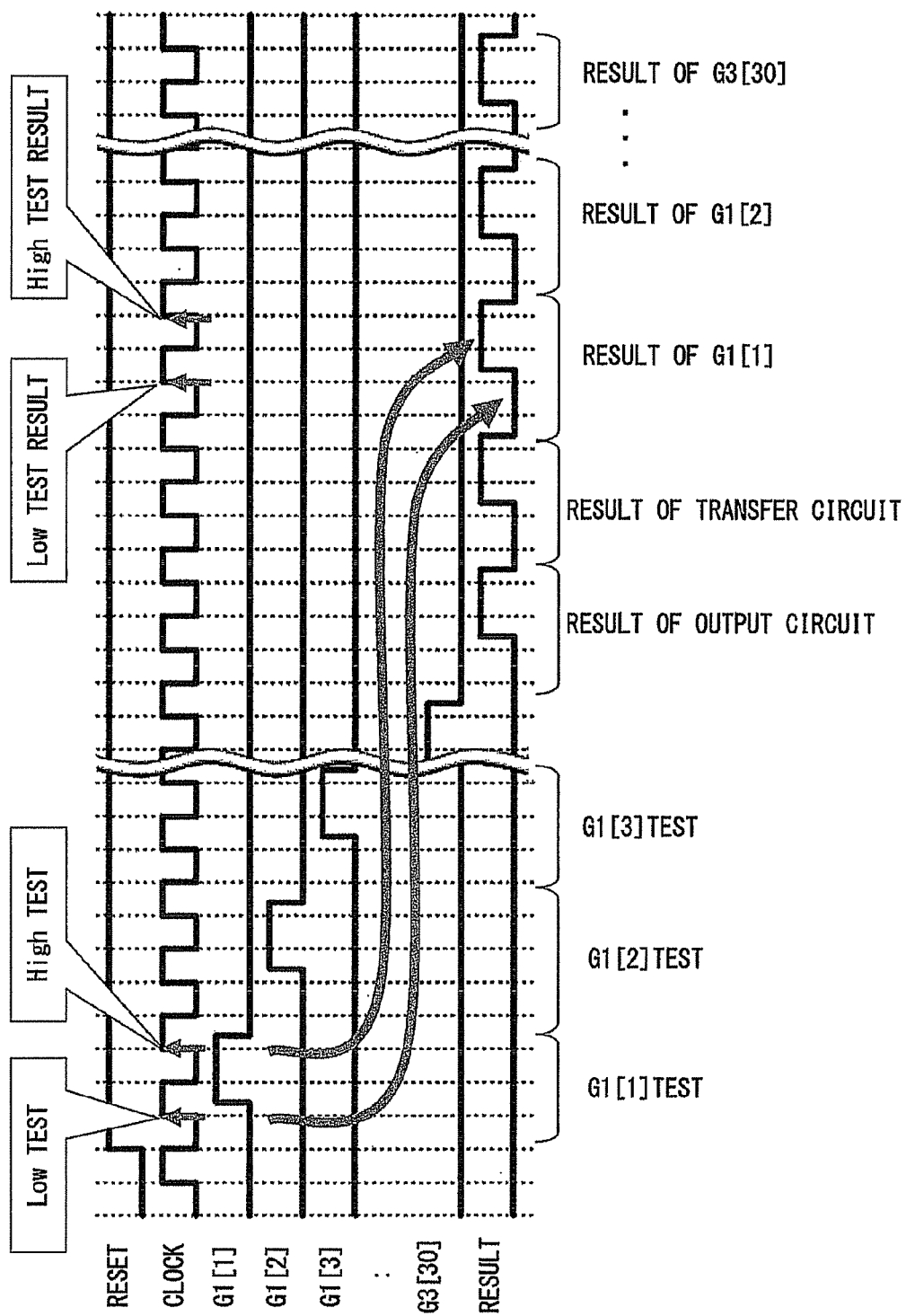

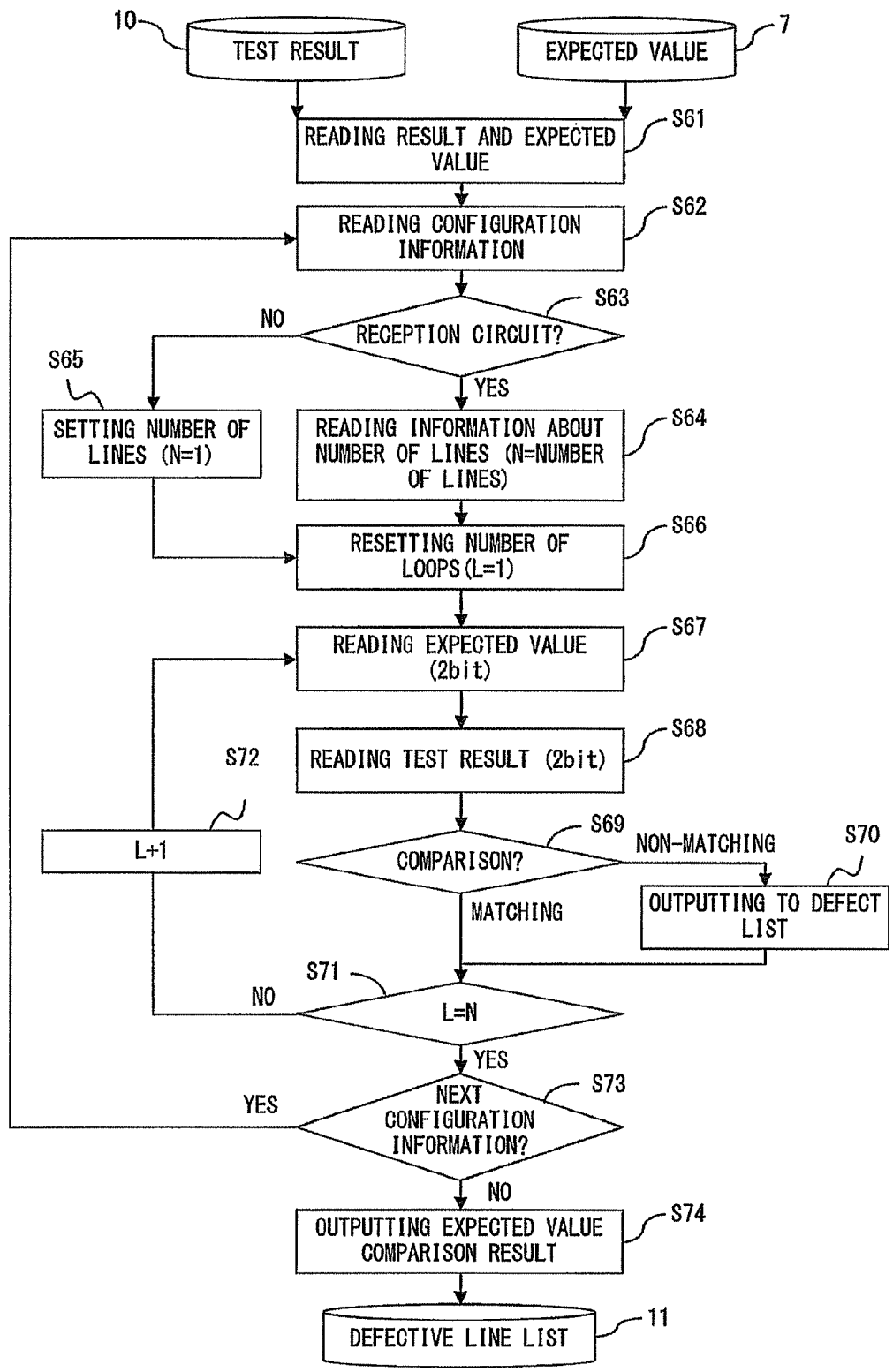
F I G. 1 6

INTER-DEVICE CONNECTION TEST CIRCUIT GENERATING METHOD, GENERATION APPARATUS, AND ITS STORAGE MEDIUM

CROSS-REFERENCE TO RELATED APPLICATION

This application is a continuation application of International PCT Application No. PCT/JP2007/000230, filed on Mar. 15, 2007, the entire contents of which are incorporated herein by reference.

FIELD

The present invention relates to a system of designing and manufacturing a large-scale semiconductor integrated circuit (LSI), and more specifically to a method, an apparatus, and a program for generating a connection test circuit for testing a connection line interconnecting a plurality of devices arranged on an LSI substrate.

BACKGROUND

A final product of a semiconductor substrate loaded with a large-scale semiconductor integrated circuit (LSI) is mass-manufactured using an ASIC (application specific integrated circuit) as a function device whose use is specified. When the product is designed and manufactured, a prototype is generated before the mass-manufacture.

On the semiconductor substrate as a prototype, a number of FPGAs (field programmable gate arrays) or PLDs (programmable logic devices) whose functions can be changed by a program are placed. A line connection is made among these devices, the processes are performed up to a logic debug using the prototype, and the FPGAs and the PLDs are changed into the ASIC, thus performing the procedure of a development.

In testing the above-mentioned prototype, it is necessary to conduct a sufficient test on a disconnection, a short-circuit, a defective solder joint, etc. among the devices such as a number of FPGA etc. loaded into the semiconductor substrate.

As a system for testing a prototype implemented on a substrate, a JTAG (joint test action group) system standardized as the IEEE Standard 1149.1 is used. To conduct a test in this system, it is necessary to prepare dedicated hardware, software, etc., thus requiring a large cost and a prolonged period for preparing a test circuit.

The patent document 1 describing the prior art for checking a connection line between the devices such as a number of FPGAs loaded into the substrate discloses the method of using a test circuit configured by a control circuit for generating an input pattern signal, and a shift register coupled to receive an input pattern signal from the control circuit. In this method, there is a problem that it is necessary to design a dedicated test circuit for each substrate in advance with the device configuration, the number of connection lines among the devices, external resources, etc. taken into account.

Similarly, the patent document 2 as prior art technology discloses a checking method in which comparison data corresponding to check data is generated to individually determine a line connection error etc. In this method, it is necessary to hold a large number of determination patterns for determining a result, and to provide a compression conversion circuit for determination data, memory for storing determination data, and external resources such as a connector for each FPGA for outputting a determination result. Accordingly, it is necessary to design the entire system by considering the necessary memory capacity or the necessity to add external resources.

In the conventional system for testing the connection line between the devices, it is necessary to change the test circuit depending on the connection mode among the FPGA or the number of connection lines, and check and customize the testing system for each substrate, thereby requiring specific operations and a long processing time. In addition, when external parts and external connections are required exclusively for a test, it is necessary to check the testing system before designing a substrate.

Patent Document 1: Japanese Laid-open Patent Publication No. 2000-121696 "Test Circuit for Multiple FPGA System"

Patent Document 2: Japanese Laid-open Patent Publication No. 2004-151061 "Inter-Device Connection Line Checking Method"

SUMMARY

In the inter-device connection test circuit generating method of the present invention, a connection test circuit is generated corresponding to the line connection among a plurality of devices by receiving the input of the data of the connection relation indicating the devices mutually line-connected among a plurality of devices, the number of connection lines corresponding to the respective connection relations, and the device outputting a test result.

In this method, connection destination devices are sequentially searched for corresponding to the connection line between the connection destination devices from the output terminal of a result output device, a test route for a connection test is generated, and a formatted test circuit module corresponding to a plurality of devices is embedded in the generated test route, thereby generating a connection test circuit.

The inter-device connection test circuit generation apparatus according to the present invention generates a connection test circuit using the above-mentioned test circuit generating method, and the computer-readable portable storage medium, on which is stored the program for enabling a computer to execute the above-mentioned generating method.

According to the present invention as described above, a test route for a connection test is generated from the data of the connection relation between the devices, the number of lines for each connection relation, and the test result output device, and a formatted test circuit module is embedded corresponding to the route, thereby automatically generating a connection test circuit.

According to the present invention, a test circuit can be automatically generated using a formatted test circuit module without a necessity of the resources exclusive for a test. Therefore, the operations of checking or customizing a testing system for each substrate are not required, thereby considerably reducing the test preparation process, and contributing to the improvement of designing efficiency for a large-scale semiconductor integrated circuit.

BRIEF DESCRIPTION OF DRAWINGS

FIG. 1 is a block diagram of the functions illustrating the principle of the inter-device connection test circuit generating method according to the present invention;

FIG. 3 is an explanatory view of the flowchart of the outline of the connection line test mainly of the process of the inter-FPGA connection test circuit generation device according to an embodiment of the present invention;

FIG. 6 is an example of the configuration of the transmission circuit;

FIG. 11 is a detailed flowchart of the test circuit and the process of generating an expected value;

FIG. 13 illustrates the contents of the expected value file;

FIG. 14 is an explanatory view of the time arrangement of the expected value data pattern;

FIG. 15 is a time chart of the connection line test using the test circuit illustrated in FIG. 4; and FIG. 16 is a detailed flowchart of the defective line list output process performed by comparing an expected value with a test result.

DESCRIPTION OF EMBODIMENT

FIG. 1 is a block diagram of the functions illustrating the principle of the inter-device connection test circuit generating method according to the present invention. FIG. 1 is a block diagram of the functions illustrating the principle of the inter-device connection test circuit generating method for testing the connection line connecting a plurality of devices, for example, the ASICs as partial semiconductor devices commonly arranged on a printed circuit.

In FIG. 1, the input of the data indicating the connection relation about the devices interconnected by lines among the plurality of devices, the number of connection lines corresponding to the connection relation, and the devices outputting a test result is received in step S1, and the connection destination device is sequentially retrieved corresponding to the connection line to the above-mentioned line connected destination device from the output terminal of the result output device and a test route for a connection test is generated in step S2, and a corresponding test circuit module is embedded in the plurality of devices on the test route generated in step S3, thereby generating a connection test circuit.

Figure 2:
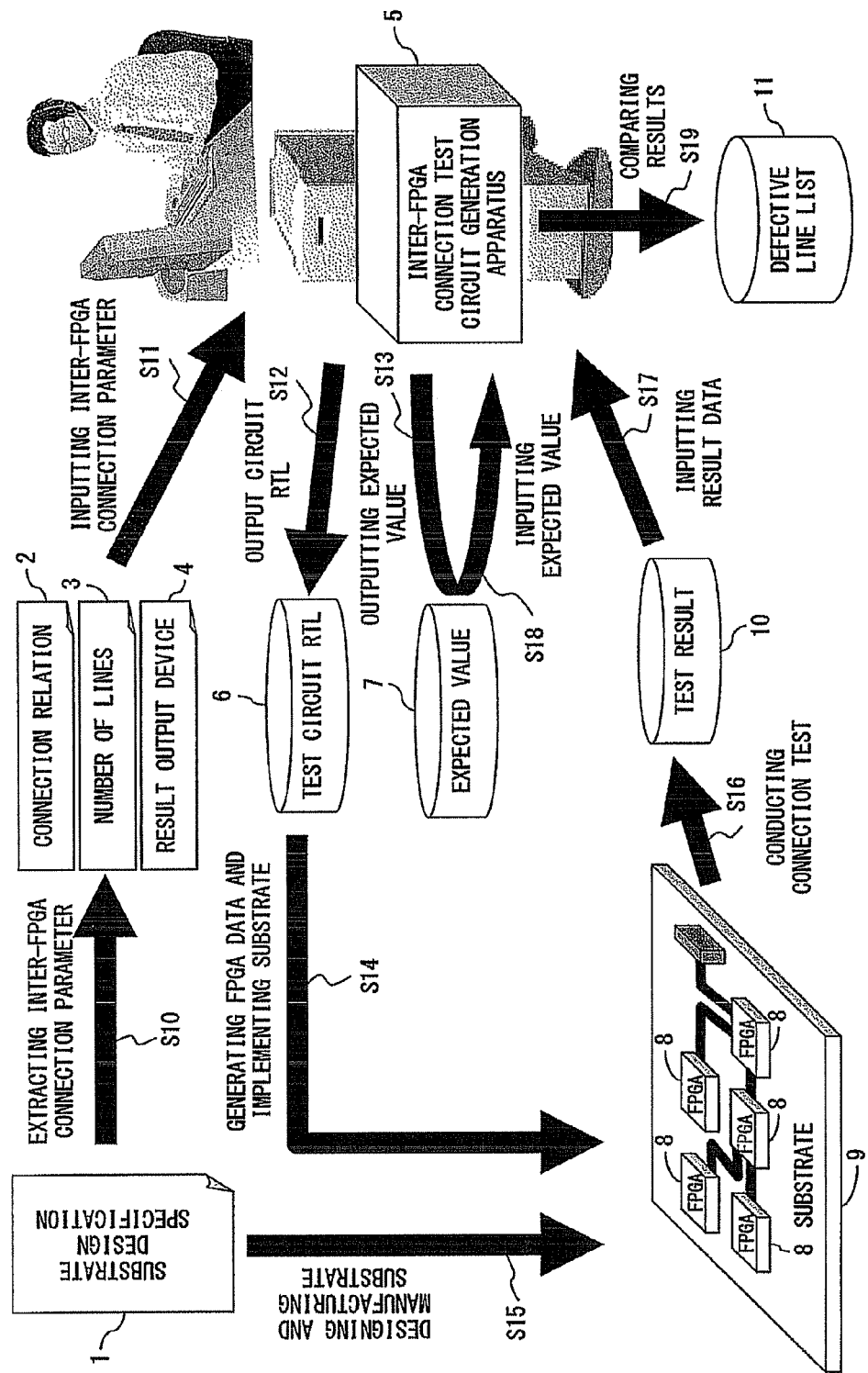
FIG. 2 is an explanatory view of an entire flowchart of the inter-device connection line testing system according to an embodiment of the present invention.

FIG. 2 is an explanatory view of an entire flowchart of the inter-device connection line testing system according to an embodiment of the present invention. In FIG. 2, the inter-device connection test is performed by the control of an inter-FPGA (field programmable gate array) connection test circuit generation apparatus 5.

In FIG. 2, an inter-FPGA connection parameter extracting process is performed in step S10, and the data of extracted connection relation 2, number of lines 3, and result output device 4 is input to the inter-FPGA connection test circuit generation apparatus 5 as inter-FPGA connection parameters in step S11.

In response to the input of the inter-FPGA connection parameters, a circuit RTL (register transistor logic) for generating a test circuit is output from the inter-FPGA connection test circuit generation apparatus 5 in step S12 and stored as a test circuit RTL 6 in the memory, and an expected value to be output from the result output device 4 is output in step S13 and stored in memory 7 for storing the expected value.

In step S14, data for realizing a test circuit on the FPGA is generated from the data of the test circuit RTL 6 and a substrate is implemented. In step S15, a substrate is designed and manufactured from the substrate design specification 1, and a substrate 9 loaded with a plurality of FPGAs 8 is manufactured. Each of the FPGAs 8 corresponds to a partial device on the LSI chip as a practical product. However, it does not have a function on the LSI chip as a practical product, but is loaded with a test circuit for testing a line on the substrate for connecting each FPGA 8. That is, the connection line between the FPGAs 8 on the substrate 9 illustrated in FIG. 2 is basically the same as the device on the LSI chip of a practical product, for example, the connection line between the ASICs, and the test circuit module for testing the connection line is loaded on each FPGA 8 as necessary.

In step S16 illustrated in FIG. 2, conducted is a connection test for testing a connection line between the FPGAs on the substrate 9 loaded with a plurality of FPGAs 8, and a test result 10 is stored in the memory. The test result is input to the inter-FPGA connection test circuit generation apparatus 5 as result data in step S17, the expected value 7 is similarly input in step S18, the result data is compared with the expected value in step S19, and a defective line list 11 is output when there is a defective point in the line as a result of the comparison.

FIG. 3 is an explanatory view of the flowchart of the inter-device connection test system on the basis of the process of the inter-FPGA connection test circuit generation apparatus 5 illustrated in FIG. 2. In FIG. 3, as described with reference to FIG. 2, the data of the connection relation 2, the number of lines 3, and the result output device 4 is provided for the test circuit generation apparatus 5, and the process by the test circuit generation apparatus 5 is started.

In the test circuit generation apparatus 5, the process by a test route search unit 15 is first performed. In the test route searching process, a connection destination device is sequentially retrieved from the output terminal of the result output device 4 corresponding to the connection line to the connection destination device of the result output device 4, and a test route for a connection test is generated.

Then, a process by a test circuit/expected value generation unit 16 is performed. In this process, a test circuit module 18 corresponding to a plurality of devices is embedded in the test route retrieved by the test route search unit 15, and a test circuit and an expected value to the output of the circuit are generated. In the present embodiment, one of a transmission circuit 19, a reception circuit 20, a transfer circuit 21, and an output circuit 22 is selected as necessary as the test circuit module 18, a program for allowing each FPGA to realize the function is generated. These test circuit modules can be illustrated as circuit charts as described later, but can be basically output as the test circuit RTL 6 in the form of a source code described in, for example, the VHDL (very high speed integrated circuit hardware description language), and a corresponding expected value 7 can be output.

As described above-mentioned with reference to FIG. 2, the FPGA data can be generated and a substrate can be implemented using the data of the test circuit RTL 6 on the practical substrate side and FPGA data 24 is generated in step S14, and a connection test is conducted and the test result 10 is acquired in step S16.

The data of the test result 10 and the expected value 7 are input to a result comparison unit 17 in the test circuit generation apparatus 5, the expected value is compared with the test result 10, and when a defective point is detected in the connection line, the defective line list 11 indicating the point is output.

Figure 4:
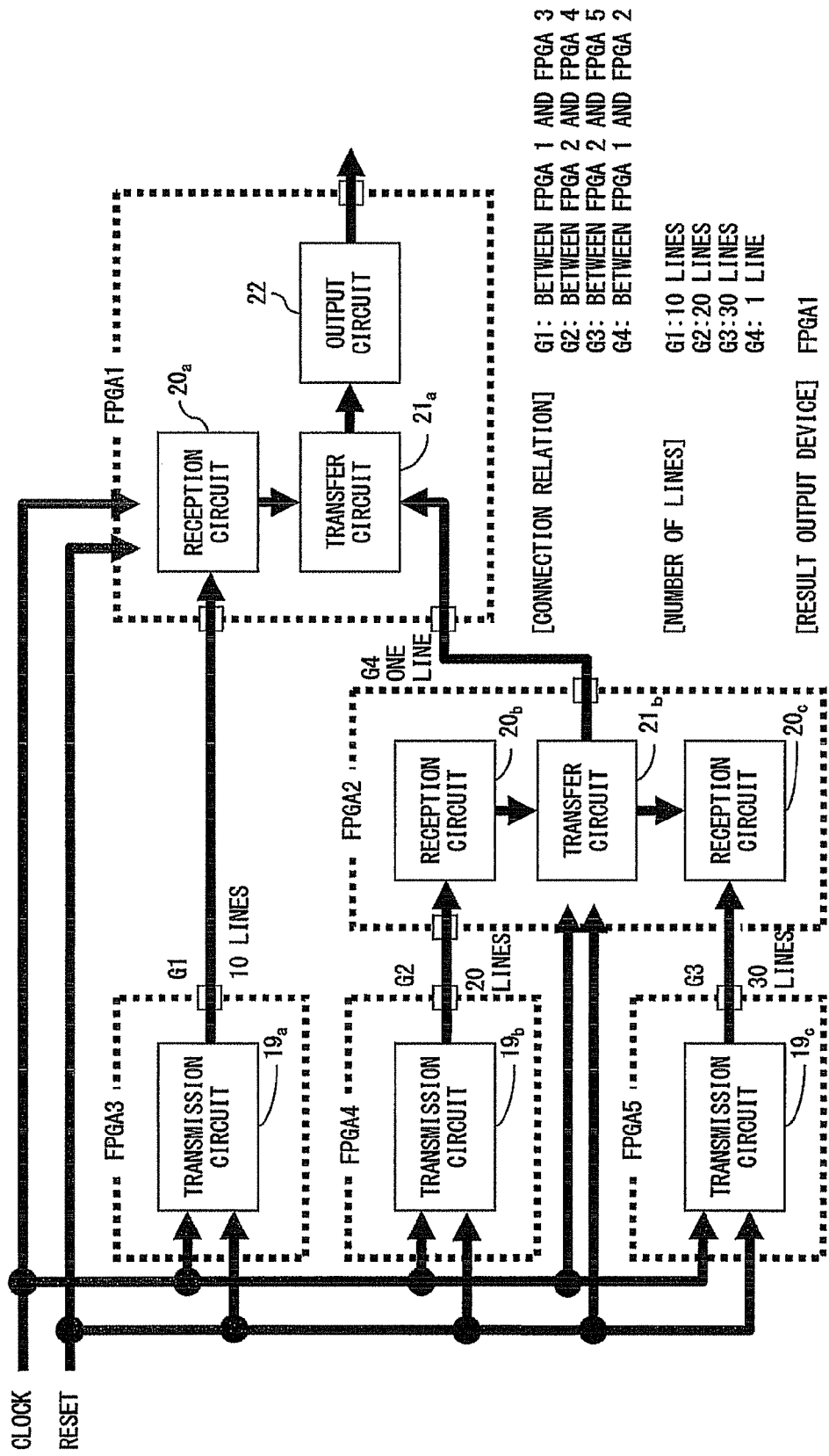
FIG. 4 is an example of the configuration of the test circuit.

FIG. 4 is an explanatory view of an example of the configuration of an inter-device connection test circuit. In FIG. 4, a test circuit for testing a connection line between five FPGAs from FPGA1 to FPGA5 corresponding to the partial devices on the LSI loaded on the practical printed circuit is configured.

In the present embodiment, the object of a test can be attained if a defective point such as a disconnection, a short circuit, a soldering error, etc. can be designated in each connection line for interconnecting a plurality of partial devices on an LSI chip as a practical product, and it is not necessary that the direction of the signal transmitted in each connection line is the same as the direction of the signal on the LSI as a practical product. Therefore, it is not an essential problem from which device a test result is to be retrieved, and any device can be specified as a result output device.

In FIG. 4, the FPGA 1 is specified as the result output device 4 provided for the inter-FPGA connection test circuit generation apparatus 5 in, for example, FIG. 2, and the signals from the programmable devices from other four FPGAs, that is, the FPGA 2 through the FPGA 5, are finally communicated to the FPGA 1, and output from the FPGA 1. Therefore, in the FPGA 1, the output circuit 22 for outputting a test result in the test circuit module 18 described with reference to FIG. 3 is required.

On the practical printed circuit, the FPGA 1 is connected to the FPGA 3 through ten lines, and to the FPGA 2 through one line. The FPGA 2 is connected to the FPGA 4 through 20 lines, and to the FPGA 5 through 30 lines. The connections are determined by an FPGA8 loaded on the substrate 9 as described above with reference to FIG. 2, that is, the connection relation between the partial devices arranged on the practical LSI chip.

In the FPGA 1, a reception circuit 20a for receiving data transmitted from the FPGA 3 directly connected through the ten lines is required. Additionally required is a transfer circuit 21a for outputting the data received by the reception circuit 20a and the data transmitted from the FPGA 2 through one line to the output circuit 22 through one output route. Generally, a transfer circuit is to output data received from two input signal lines as serial data from one signal line, and the transfer circuit 21a converts the test data input from the FPGA 2 through one line and the test data input from the reception circuit 20a through one route into a serial signal, and provides the signal for the output circuit 22.

In the FPGA 3, a transmission circuit 19a for transmitting test data to the reception circuit 20a in the FPGA 1 through 10 lines is required. Generally, the transmission circuit 19 outputs test data to a connection destination device corresponding to a clock signal and a reset signal of a system, and it is not necessary to input data to the transmission circuit 19.

Required in the FPGA 2 are a reception circuit 20b for receiving test data transmitted through 20 connection lines to the FPGA 4, a reception circuit 20c for receiving test data transmitted from the FPGA 5 through 30 connection lines, and a transfer circuit 21b for outputting, through one line connected to the FPGA 1, test data provided from the two reception circuits through each route.

Furthermore required in the FPGA 4 is a transmission circuit 19b for outputting test data to the reception circuit 20b in the FPGA 2, and required in the FPGA 5 is a transmission circuit 19c for outputting test data to the reception circuit 20c.

Figure 5:
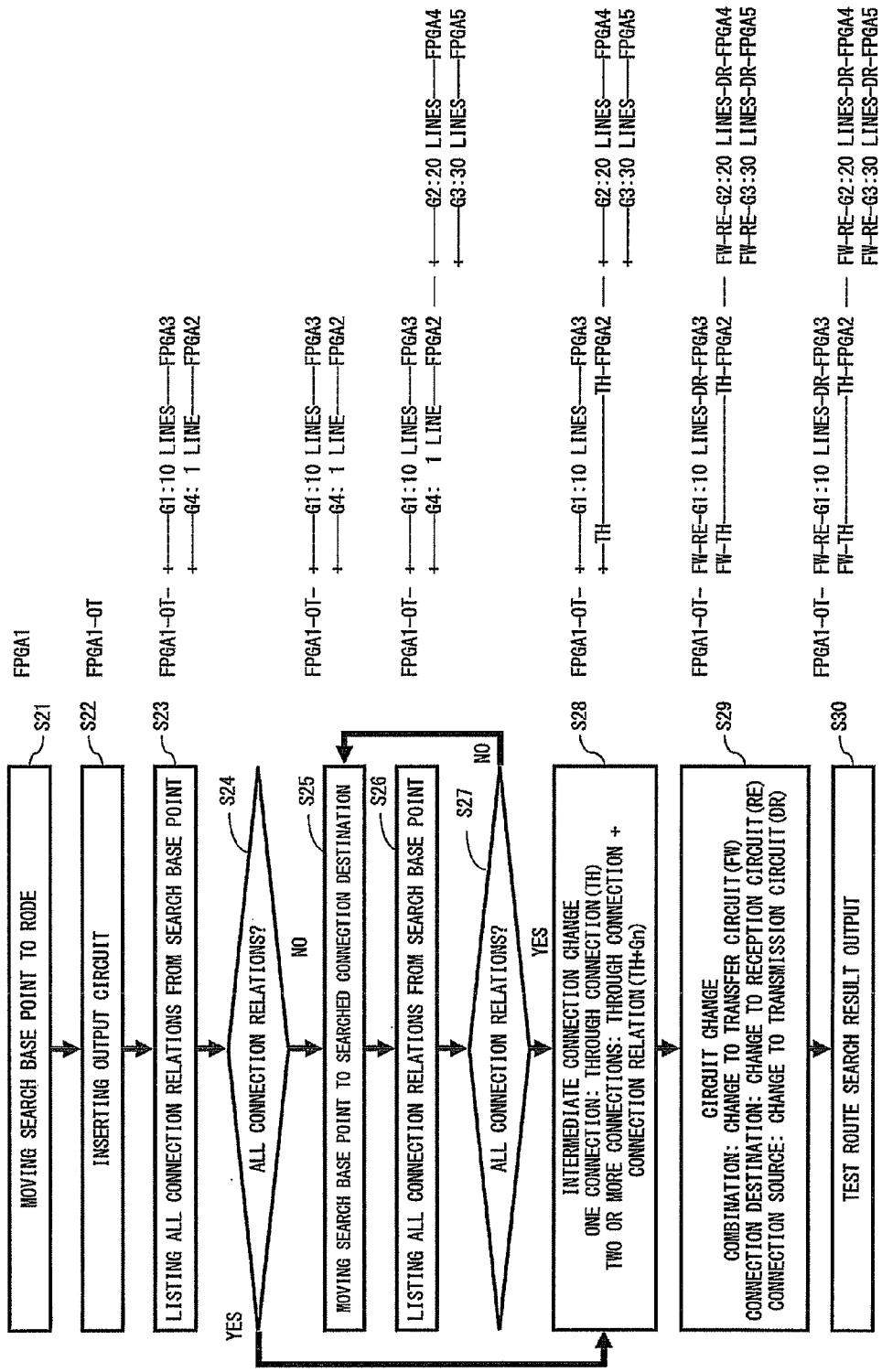
FIG. 5 is a detailed flowchart of the test route searching process.

FIG. 5 is a detailed flowchart of the test route searching process by the test route search unit 15 illustrated in FIG. 3.

When the process is started as illustrated in FIG. 5, the result output device, that is, the FPGA 1 illustrated in FIG. 4, is set as a search base point in step S21. In step S22, the output circuit OT for outputting a result to the device is inserted. In step S23, all connection relations from the FPGA 1 as the search base point are listed in step S23. In FIG. 4, the connection relations between the FPGAs 2 and 3 are listed, and the number of lines of the G1 and G4 as the connection relations is described on the right.

Next, it is determined in step S24 whether or not all connection relations have been listed. Since there are G2 and G3 remaining as the connection relations as illustrated in FIG. 4, the search base point is transferred to the connection destinations retrieved, that is, the FPGA 2 and the FPGA 3 in step S25, and the entire connection relations are listed from the search base point in step S26. The listed connection relations are G2 and G3 from the FPGA 2 to the FPGAs 4 and 5 as illustrated on the right, and the respective numbers of lines are 20 and 30.

Next, in step S27, it is determined whether or not all connection relations have been checked. Since all connection relations are checked in FIG. 4, the intermediate connection changing process is performed in step S28. If all connection relations have not been checked in step S27, the processes from step S25 are repeated. If it is determined in step S24 that all connection relations have been checked, control is immediately passed to the process in step S28.

In step S28, if there is only one line for the connection relations, the display is switched to the description using TH as a through connection. If there are two or more lines, the display is switched to the description using TH as the through connection and Gn as the number of lines as necessary. That is, as illustrated on the right, G4 corresponding to one line is switched to the TH description as a through connection. The TH indicates that a transfer circuit is required for each of the FPGA 1 and the FPGA 2 corresponding to the G4 as one connection line between the FPGA 1 and the FPGA 2 as illustrated in FIG. 4. In FIG. 4, there is no point requiring a transfer circuit, and no intermediate connection change to a display format of TH+Gn for two or more connection relations.

Then, the process of changing a circuit is performed in step S29. The circuit change is to embed a transfer circuit FW, a reception circuit RE, and a transmission circuit DR in the test route already retrieved. The processes of embedding a transfer circuit FW at a point where signals get together, a reception circuit RE at a connection determination of each connection relation, and a transmission circuit DR at a connection source are performed as illustrated in FIG. 4, and a test route having the transmission circuit, the reception circuit, the transfer circuit, and the output circuit as test circuit modules is output as a test route retrieval result in step S30.

Then, an example of a practical configuration from the transmission circuit to the output circuit as the test circuit module 18 described with reference to FIG. 3 is described below with reference to FIGS. 6 through 9. These circuits are only examples and when a test route is searched in the process performed by the test route search unit 15 as illustrated in FIG. 3, the process by the test circuit/expected value generation unit 16 is performed using the searching result, and a source code for a test circuit is generated. That is, the test circuit source code is described in, for example, the hardware description language VHDL, and a circuit practically programmed on an FPGA module can be any circuit for realizing a function corresponding to the source code, and the circuits illustrated in FIGS. 6 through 9 are examples of the test circuit module 18.

FIG. 6 is an example of a transmission circuit. The transmission circuit includes a counter 27, a register 28 storing a test start cycle (TS), a comparator 29 for comparing the value of the TS with the count value C of the counter 27 and outputting "H" when the C is equal to or exceeds the TS, and five FFs (flip-flops) 31 through 35 in the G1 illustrated in FIG. 4 for transmitting test data corresponding to ten lines in the G1 illustrated in FIG. 4.

In FIG. 6, the FFs 31 and 32 in the above-mentioned FFs output test data to one of the 10 lines between, for example, the FPGA 3 and the FPGA 1, and the FFs 33 and 34 output test data to the second line. Therefore, the transmission circuit 19a provided in the FPGA 3 requires a total of 20 FFs. However, since the operations of outputting test data by the two FFs to the second and tenth lines in the ten lines are all the same, the display of the two FFs for outputting data to the third and the subsequent lines is omitted except the FF 35 in FIG. 6.

As described later, in the test of the connection lines between the FPGAs in FIG. 4, test data is transmitted from each of the FPGAs 3 through 5 on the left. However, according to the present embodiment, for example, the test data "0" and "1" are transmitted in 2 cycles to each of the lines to test the ten lines of the connection relation G1 between the FPGAs 3 and 1. When the transmission of the test data to the ten lines of the connection relation G1 is completed in 20 cycles, the test data is transmitted sequentially to the 20 lines of the connection relation G2 between the FPGAs 4 and 2, thereby testing the circuit example in FIG. 4.

If FIG. 6 illustrates the transmission circuit 19a for transmitting test data to the connection relation G1 between the FPGAs 3 and 1 illustrated in FIG. 4, then the transmission of the test data to 10 lines corresponding to the connection relation G1 is started by the comparator 29 providing the enable terminal of each of the FFs 31 through 35 with "H" in the cycle 0 in which the entire test is started. At this time, it is assumed that the counter 27 is reset by a reset signal RST.

In the cycle 0, the FF 31 is preset, and the output Q is "1". Other FFs 32 through 35 are cleared by the reset signal RST, and the output Q is all "0".

Since the data input of the FF 31 is grounded when the number of cycles determined by the clock signal CK is "1", the output Q is "0", the output of the FF 32 is changed to "1", and the output of the FFs 33 through 35 is all "0" as is. Therefore, in the cycles 0 and 1, the output Q of the FF 32 is "0, 1" and the value is received by the reception circuit 20a in the FPGA 1 in FIG. 4, thereby transmitting "0" and "1" as test data to the first number of lines in the ten lines of the G1. Similarly, when the output Q of the FF 34 is considered, the value is "0, 0, 0, 1" in the cycles 0 through 3, and the output to the cycles 2 and 3 is received by the reception circuit 20a, thereby transmitting test data to the second line.

As described above, the tests on the third through tenth lines are conducted similarly as on the second line. When the transmission circuit illustrated in FIG. 6 is the transmission circuit 19b in the FPGA 4, the test start cycle for the transmission circuit illustrated in FIG. 6 has the number of cycles for transmitting data of "0" and "1" for the number of lines of the connection relation G1, that is, the cycle 20 that is double the number of lines of the G1. The test start cycle for the transmission circuit 19c in the FPGA 5 is similarly double the sum of the number of lines of the G1 and G2, that is, the cycle 60.

Figure 7:
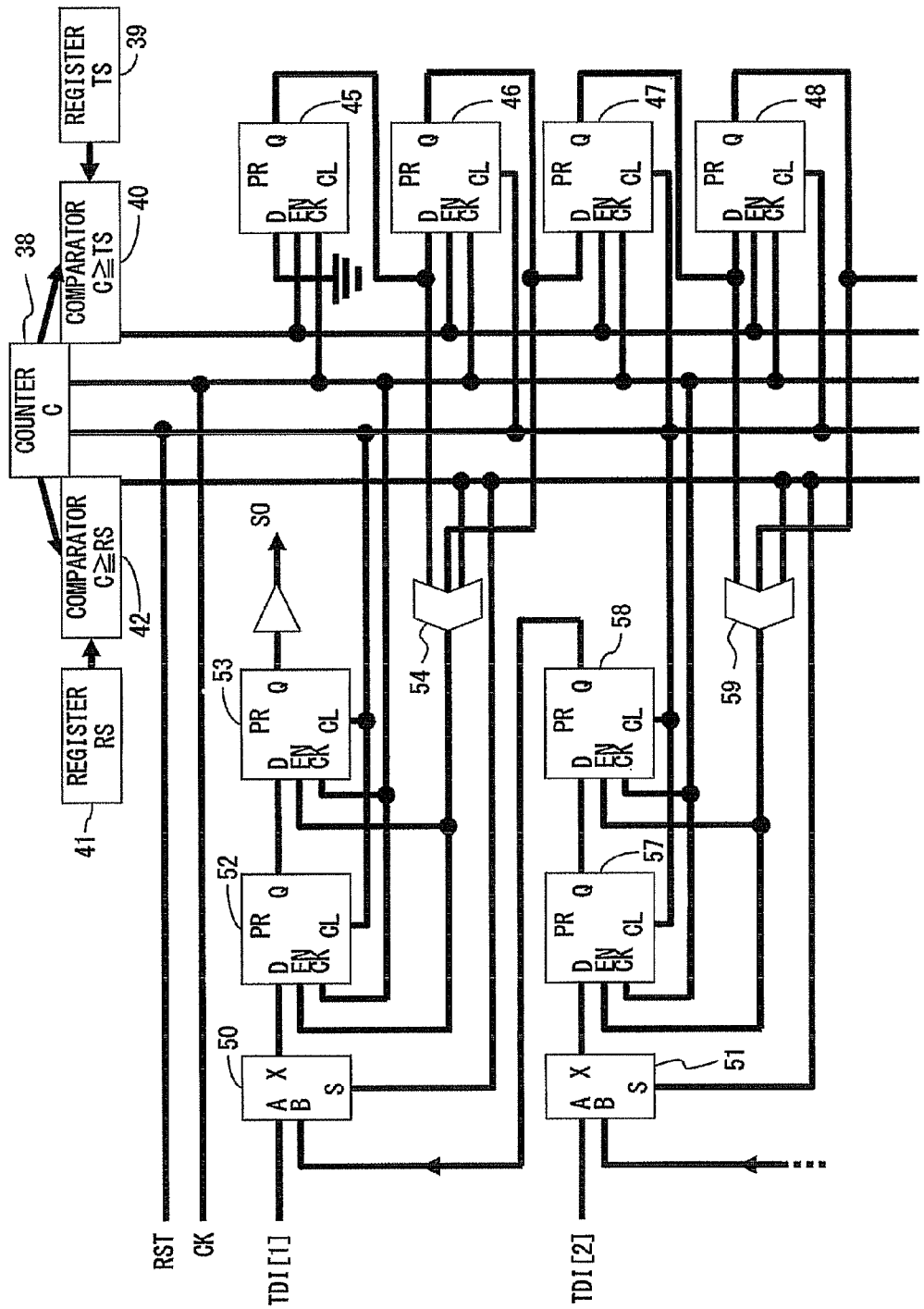
FIG. 7 is an example of the configuration of the reception circuit.

FIG. 7 is an example of the configuration of the reception circuit. In FIG. 7, the reception circuit includes a counter 38 for counting the clock CK, a register 39 for storing the start of the operation of the reception circuit, that is, a test start cycle TS, a comparator 40 for comparing the test start cycle TS with the count value C of the counter 38, and outputting "H" when the C is equal to or exceeds the TS, a register 41 for storing a result start cycle RS as an output start cycle in which test data is output as a serial signal after storing in the reception circuit the test data transmitted from the transmission circuit, a comparator 42 for outputting "H" when the count value C of the counter 38 reaches or exceeds the RS, FFs 45 through 48 for providing an enable signal for the FFs (FFs 52, 53, 57, and 58) for receiving test data from a corresponding transmission circuit and temporarily storing the data, selectors 50 and 51 for receiving test data from a corresponding transmission circuit, two FFs 52 and 53 for temporarily storing test data transmitted through a connection line to the corresponding transmission circuit, for example, through the first line in the ten lines, FFs 57 and 58 for temporarily storing test data transmitted through the second line, and OR gates 54 and 59 for outputting an enable signal to the two FFs 52 and 53, and 57 and 58.

In FIG. 7, when the number of cycles corresponding to the entire system reaches the value of the TS and the comparator 40 outputs "H", an enable signal is provided for all FFs 45 through 48 vertically arranged on the right. At this time, preset input is provided for the FF 45, and the output Q is "1". When the test is started, that is, in the first cycle, the FF 45 provides an enable signal for the two FFs 52 and 53 through the OR gate 54. At this time, the comparator 42 has not output "H", and the selector 50 outputs a signal input to the input terminal A, that is, the test data transmitted from a corresponding transmission circuit from the output terminal X, and the data is provided for the FF 52.

Since the data input terminal of the FF 45 is grounded in the second cycle, the output Q of the FF 45 is "0". However, the data output Q of the FF 46 is "1", and an enable signal is provided for the FFs 52 and 53 through the OR gate 54. Then, the output Q of the FF 52, the first bit of the 2-bit test data is "0" as described later, and the value is provided for the FF 53, and the next test data, that is, the test data "1" transmitted through the first line from the corresponding transmission circuit is provided for the FF 52.

In the third cycle, the output Q of the FF 47 is "1", and an enable signal is provided for the two FFs 57 and 58 through the OR gate 59. At this time, the output Q of the two FFs 45 and 46 is "0", and no enable signal is provided for the two FFs 52 and 53 corresponding to the first line.

In the fourth cycle, the output of the FF 48 is "1", and an enable signal is provided for the two FFs 57 and 58 through the OR gate 59. In the third and fourth cycles, the 2-bit test data "0" and "1" to be input through the second line is sequentially stored in the two FFs 57 and 58 so that the selector 51 can selects a signal from the input terminal A.

The data transmitted from the transmission circuit through the lines up to the tenth line from the third line not illustrated in the attached drawings is stored in the corresponding two FFs. When the data is completely stored, the number of cycles of the entire system is the value of the RS stored in the register 41, a selection control signal "H" is provided for the selectors 50 and 51 from the comparator 42 as a result, and the selectors 50 and 51 output the input from the input terminal B to the FFs 52 and 57 through the input terminal X. In addition, the comparator 42 provides an enable signal to the FFs 52 and 53, and the FFs 57 and 58 through the OR gates 54 and 59. Then, the test data stored in these FFs where two FFs are assigned for each line, namely in a total of 20 FFs for ten lines, is sequentially shifted among the 20 FFs each time a clock signal is input, and is output from the reception circuit 20a in the FPGA 1 illustrated in FIG. 4 to the transfer circuit 21a as a serial signal.

Similarly in the transmission circuit illustrated in FIG. 6, the number of FFs arranged on the right in the reception circuit illustrated in FIG. 7, the selector required for each line, two FFs, and the OR gate are necessary depending on the number of connection lines between the FPGAs. Practically, in the source code described in the hardware description language VHDL, the number of lines can be specified as a parameter, and by specifying the value of the parameter as an appropriate value, the functions of a necessary number of FFs in the practical FPGA etc. are all realized. In this sense, the transmission circuit 19, the reception circuit 20, the transfer circuit 21, and the output circuit 22 are the modules that can be generally used using any number of lines.

Figure 8:
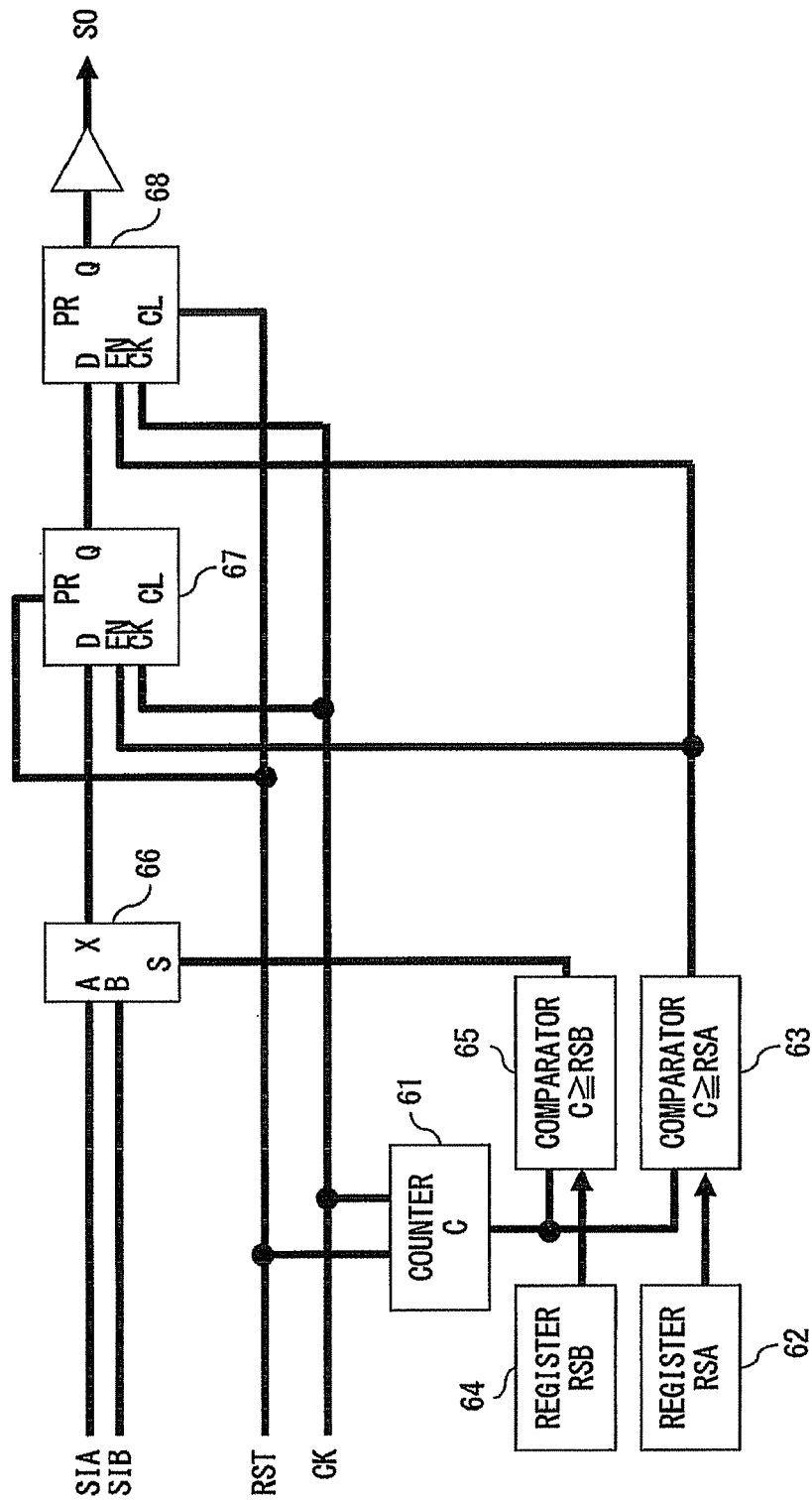
FIG. 8 is an example of the configuration of the transfer circuit.

FIG. 8 is an example of the configuration of a transfer circuit. A transfer circuit is to serially output test data input from two signal lines as described above, that is, from two lines, to one signal line, that is, a line, and can output the data as a serial signal by receiving the data from two lines after switching the selector output.

In FIG. 8, the transfer circuit is configured by a counter 61 for counting a clock signal, a register 62 for storing a result start cycle RSA in which the output of the test data from one input terminal A in the two input terminals of a selector to an output circuit or another transfer circuit is started, a comparator 63 for outputting "H" when the count value C of the counter 61 reaches or exceeds the RSA, a register 64 for storing a result start cycle RSB in which the output of the test data input from another input terminal B of the selector is started to the output circuit or another transfer circuit, a comparator 65 for outputting "H" when the count value C of the counter 61 reaches or exceeds the RSB, a selector 66 for selecting input data from two signal lines, and two FFs 67 and 68.

In FIG. 8, if the number of cycles of the entire system is equal to or exceeds the RSA, then an enable signal is provided for the two FFs 67 and 68 from the comparator 63. When the number of cycles is equal to or exceeds the RSA and is less than RSB, the output of the comparator 65 is "L". At this time, the selector 66 selects a signal from the input terminal A, and provides the signal for the FF 67. In this period, each time the clock signal is input, test data SIA input from one line through the input terminal A of the selector 66 is shifted by the two FFs 67 and 68, and provided as a serial signal for an output circuit or another transfer circuit.

When the number of cycles of the system reaches or exceeds the result start cycle RSB, the selector 66 outputs the test data SIB input from the input terminal B to the FF 67. At this time, the input signal is still provided for the two FFs 67 and 68, and the test data input from the input terminal B is sequentially provided as a serial signal to an output circuit or another transfer circuit through the two FFs 67 and 68.

When the number of cycles of the system matches the RSA, the FF 67 is preset by the reset signal, and the output Q is "1". On the other hand, the FF 68 is cleared, and the output is "0". Therefore, in a cycle when the number of cycles of the system matches the RSA, "0" is output from the FF 68, and "1" stored in the FF 67 is output in the next cycle. The data is not the input test data, but the data stored in the two FFs 67 and 68 in the transfer circuit. By checking the final value of the output of an output circuit corresponding to the data, a line connection test can be performed from a transfer circuit to an output circuit, or from a transfer circuit to another transfer circuit.

Figure 9:
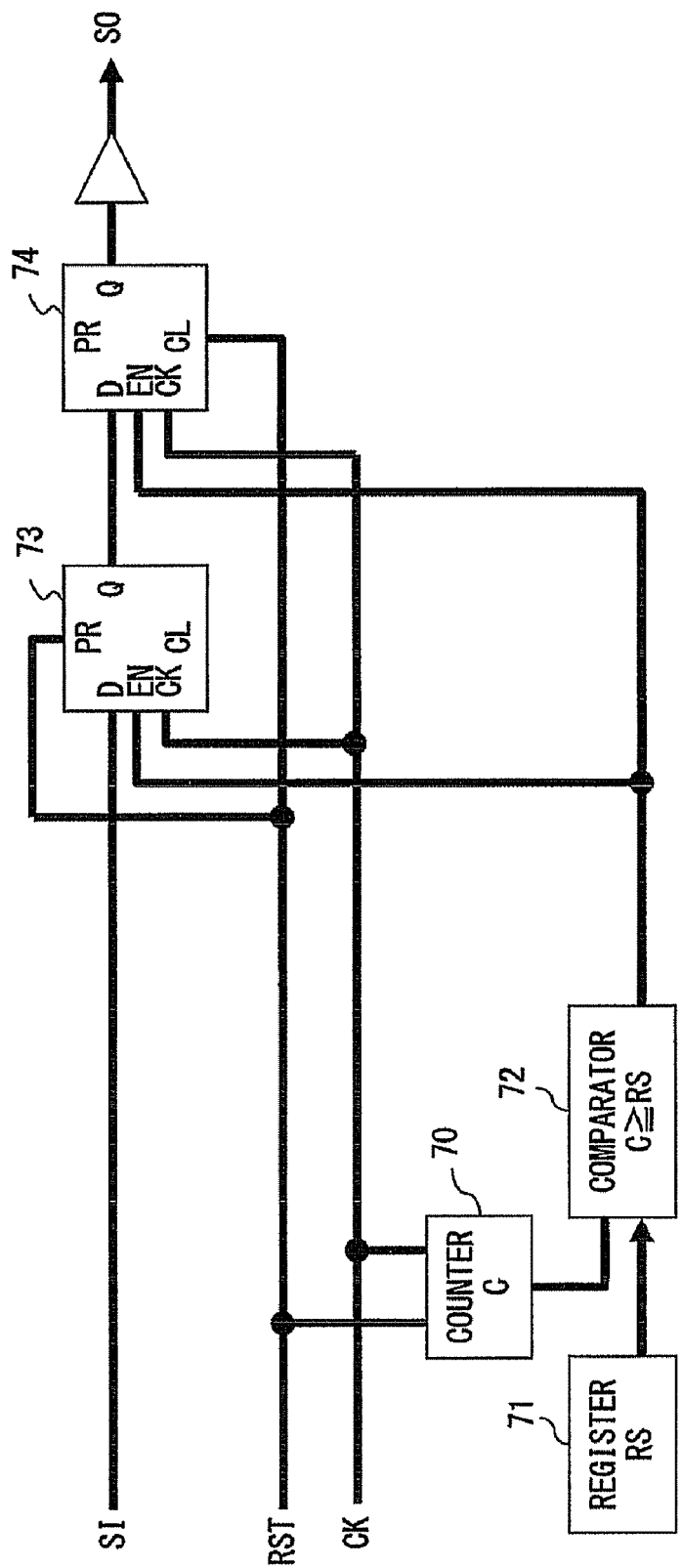
FIG. 9 is an example of the configuration of the output circuit.

FIG. 9 is an example of the configuration of the output circuit. The output circuit is generally to serially output a serial signal transmitted from a transfer circuit as a test result output signal with appropriate timing, and starts its operation when the number of cycles of a system reaches an appropriate value, that is, when it reaches the RS in this example.

In FIG. 9, the output circuit is configured by a counter 70 for counting a clock signal, a register 71 for storing the value of the RS, a comparator 72 for outputting "H" when the count value C of the 70 reaches or exceeds the RS, and two FFs 73 and 74 for shifting and outputting input data each time a clock signal is input.

When the number of cycles of the system reaches the value of the RS in FIG. 9, and an enable signal is provided from the comparator 72 to the two FFs 73 and 74, the input data provided from the transfer circuit 21a in FIG. 4 is sequentially output through the FFs 73 and 74. In this case, as with the transfer circuit described with reference to FIG. 8, the data "0" and "1" stored in the FFs 73 and 74 is sequentially output in the first two cycles, and the test of the output line from the output circuit can be conducted.

Figure 10:
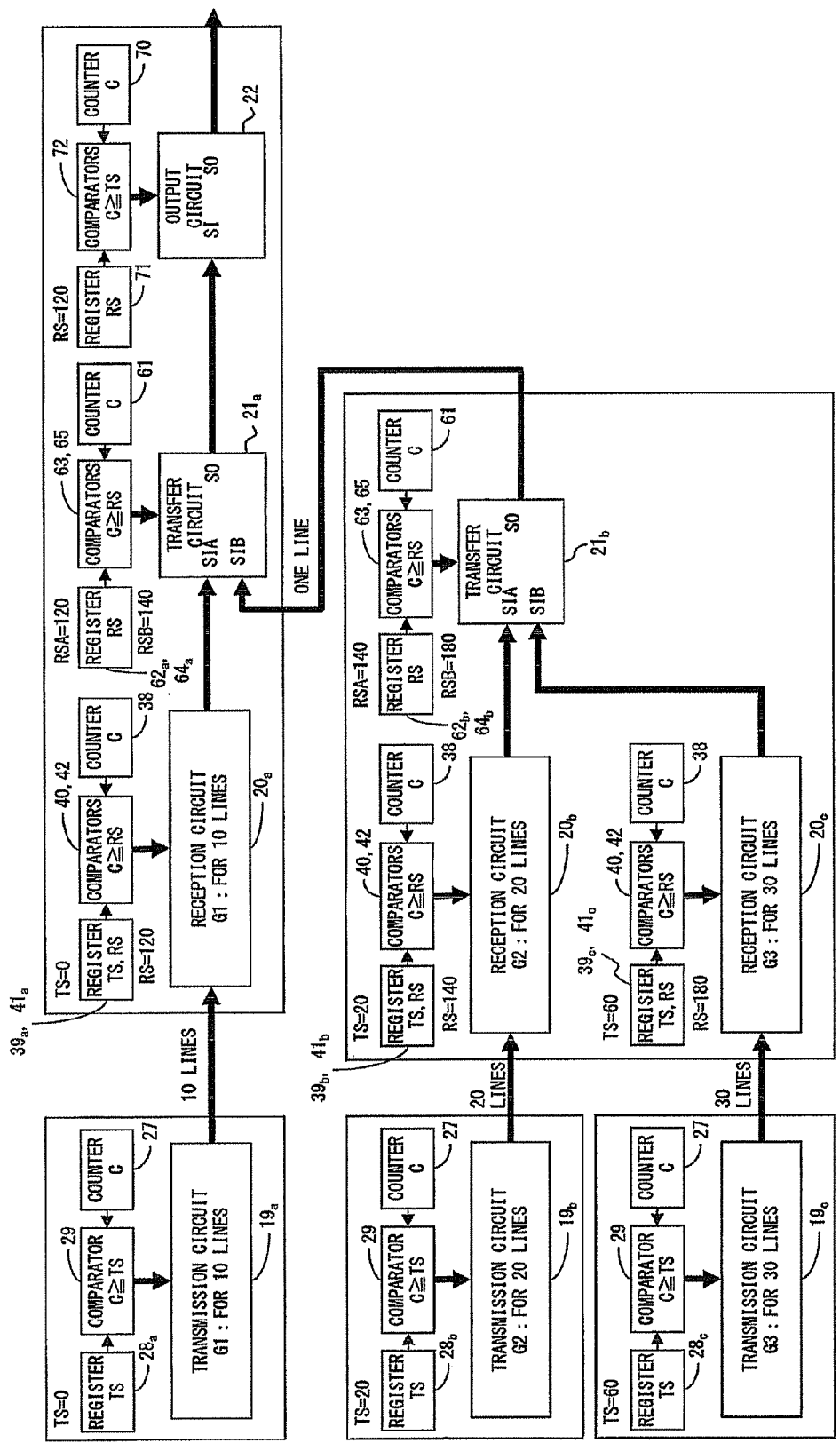
FIG. 10 is an explanatory view of the operation of the entire test circuit.

FIG. 10 is an explanatory view of the operation of the entire test circuit. In FIG. 10, test (pattern) data is output from the three transmission circuits 19a, 19b, and 19c, and the data is finally output from the output circuit 22. The entire operation is controlled corresponding to the number of cycles of a system as the entire test circuit. The number of cycles corresponds the clock signals.

To conduct a line connection test between the FPGAs described with reference to FIG. 4, the 2-bit test data of "0" and "1" is transmitted from each transmission circuit in a manner in which the transmissions do not overlap in time with respect to each line, and the data is finally output from the output circuit 22. The data pattern of an output result signal is compared with the data of an expected value when each connection line is in a normal state, and it is determined whether or not there is a defective point in each line.

In FIG. 10, first in the cycle 0, the test data is transmitted in 2 cycles, that is, "0" in the first cycle and "1" in the next cycle for each line corresponding to 10 lines from the transmission circuit 19a to the reception circuit 20a. In the cycle 19, the test data corresponding to 10 lines is completely transmitted.

Next, corresponding to 20 lines from the transmission circuit 19b to the reception circuit 20b, the test data of "0" and "1" is transmitted in 2 cycles for one line, and the test data of "0" and "1" is transmitted in the 2 cycles for one line in the cycles 20 through 59, and corresponding to the 30 lines from the transmission circuit 19c to the reception circuit 20c, the test data of "0" and "1" is transmitted in the 2 cycles or each line in the cycles 60 through 119.

As described above, the transmission of test data for testing a total of 60 line connections, each of which is from the three transmission circuits 19a through 19c to the respective reception circuits, has been completed. Therefore, in the corresponding reception circuit, the output of the data stored in the FF is started. First, from the reception circuit 20a, the output of test data is started to the transfer circuit 21a in the cycle 120. The output is completed in the cycle 139.

The data stored in the FFs in the reception circuit 20b is output to the transfer circuit 21b. The data output is started in the cycle 140, and terminated in the cycle 179. At this time, the transfer circuit 21b can output the test data whose output is started in the cycle 140 directly to the transfer circuit 21a. In the transfer circuit 21a, in the cycle 140, the selector 66 is controlled such that a signal from the input terminal B in the two input terminals to the selector 66 described with reference to FIG. 8 can be output, and a signal input from the transfer circuit 21b is received.

Furthermore, the reception circuit 20c starts the output of the test data stored in the FFs in the cycle 180 in which the output of the test data from the reception circuit 20b to the transfer circuit 21b is completed, and switches the input terminal of the internal selector, thereby receiving the data. The data output terminates in the cycle 239.

The output circuit 22 starts outputting the test data in the cycle 120 in which the output of the test data is started from the reception circuit 20a to the transfer circuit 21a. The output of the test data is performed in the order of the test data transmitted from the transmission circuit 19a to the reception circuit 20a, the test data transmitted from the transmission circuit 19b to the reception circuit 20b, and finally the test data transmitted from the transmission circuit 19c to the reception circuit 20c. However, as described about the transfer circuit illustrated in FIG. 8 and the output circuit illustrated in FIG. 9, the data stored in advance in the two FFs in these circuits are first output. Therefore, after first outputting the test data for the 2 cycles corresponding to the output line of the output circuit 22, and then outputting the test data in the 2 cycles for the connection line from the transfer circuit 21a to the output circuit 22, the test data stored in the FFs in the reception circuit 20a is output, and then the test data in the 2 cycles corresponding to one line for the transfer circuit 21a is output from the transfer circuit 21b. Then, the test data stored in the FFs in the reception circuit 20b is output, and finally the test data stored in the FFs in the reception circuit 20c is output.

In FIG. 10, only one register and one comparator are illustrated for simplicity, each register and each comparator corresponding to each reception circuit and transfer circuit. As illustrated with reference to FIGS. 7 and 8, the reception circuit includes two registers storing the TS and the RS, and two comparators for respectively comparing the values of these registers and the count values of the counters. In FIG. 8, similarly two registers for storing the RSA and the RBS and two comparators for comparing these values with the count values of the counters. In FIG. 10, only one register and one comparator are illustrated for simplicity.

In the description above, the configuration of each test circuit module and the testing operation corresponding to the example of the configuration of the test circuit illustrated in FIG. 4 are concretely described, but embedding these test circuit modules and generating corresponding expected values can be realized as more common processes. FIG. 11 is a flowchart of the processes performed by the test circuit/expected value generation unit 16 for embedding a test circuit module in a test route after a search test route is output as illustrated in FIG. 5 and generating an expected value.

Figure 12:
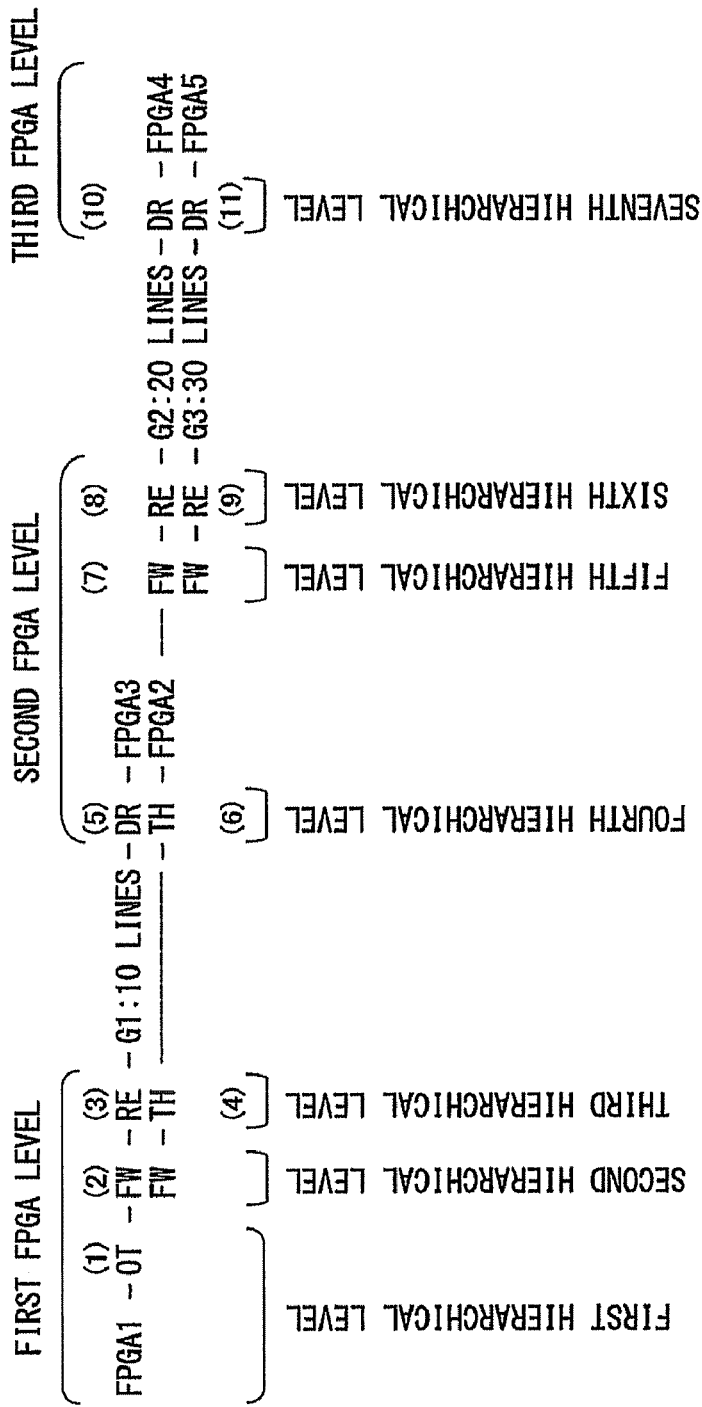
FIG. 12 illustrates a retrieved test route.

In FIG. 11, the test circuit and the expected value generating process are performed corresponding to the contents of a search test route 12 illustrated in FIG. 12. When the process is started, the base point of the process is moved to the result output device in step S35, and moved to the FPGA 1 in FIG. 4, and an output circuit and an expected value for the output circuit are inserted in step S36. The expected value is a 2-bit expected value for one output line of the output circuit, and the value is inserted into the expected value file. The FPGA 1 is one at the first hierarchical level as viewed from the result output device in which the output circuit OT belongs to the first hierarchical level and assigned the number (1).

Next, the base point is moved to the next hierarchical level in step S37. The next hierarchical level refers to the second hierarchical level in the first hierarchical level FPGA. In step S38, it is determined whether or not the second hierarchical level has a branch. In the FPGA 1 illustrated in FIG. 4, the second hierarchical level corresponds to the transfer circuit 21a. When the circuit is viewed opposite from the output circuit 22, the circuit corresponds to a branch circuit. Therefore, the transfer circuit corresponding to the branch and an expected value corresponding to the output line of the transfer circuit are inserted. This corresponds to the second hierarchical level (2) in FIG. 12.

Next in step S40, the base point is moved to the next hierarchical level, that is, the third hierarchical level illustrated in FIG. 12. In this example, it is determined that there is a branch in step S38. However, when there is no branch, it is obvious that control is passed to step S40 without performing the process in step S39.

Then, the connection in the same hierarchical level is listed in step S41, and the connections listed in step S42 are set as a group. In step S43, it is determined whether or not there is a reception circuit in the group corresponding to the third hierarchical level illustrated in FIG. 12. The third hierarchical level corresponds to the reception circuit 20a in the FPGA 1. Therefore, it is determined in step S43 that there is a reception circuit. In step S44, a reception circuit and an expected value corresponding to the reception circuit are inserted. The reception circuit corresponds to (3).

Next, in step S46, it is determined whether or not the processes for all the connection lists listed in step S41 have been completed. In this example, since there is one more connection line for the remaining connection in the third hierarchical level in FIG. 12, control returns to step S42 and a connection group is set. It is determined in step S43 whether or not there is a reception circuit. Since the remaining connection does not correspond to a reception circuit, a through connection is inserted in step S45. In FIG. 12, the through connection indicated by the TH of (4) is inserted. Then, in step S46, it is determined that the process corresponding to a connection listed in the third hierarchical level has been terminated, and the base point is moved to the next hierarchical level, that is, the fourth hierarchical level, in step S47.

In step S48, the connection in the fourth hierarchical level is listed, and the connection group is set in step S49. In step S50, it is determined whether or not the transmission circuit is in the connection group. In this example, since the transmission circuit DR is in the fourth hierarchical level, a transmission circuit is inserted as (5) in step S51.

In step S53, it is determined whether or not all processes for the connections listed in the fourth hierarchical level have been completed. In this example, since there is still a connection including the TH, it is determined in step S50 whether or not there is a transmission circuit, a through connection is inserted as (6) in step S52, it is determined in step S53 that the process for the connection listed in the fourth hierarchical level has been completed, and it is further determined in step S54 whether or not there is a next hierarchical level. Since there are still the fifth and subsequent hierarchical levels, control is returned to step S37, and the processes are repeated.

The subsequent processes are roughly described as inserting an expected value corresponding to a transfer circuit as indicated by (7) with respect to the fifth hierarchical level in step S39, inserting the reception circuits of (8) and (9) and the expected values, inserting the transmission circuits of (10) and (11) for the seventh hierarchical level in step S51, determining in step S54 that there is no next hierarchical level, and outputting the test circuit RTL 6 and the expected value 7 in step S55, thereby terminating the process.

FIG. 13 illustrates the contents of the expected value file corresponding to the example of the circuit illustrated in FIGS. 4 and 10. The expected value file is configured by the 2-bit expected value pattern for the output circuit 22, the 2-bit expected value pattern for the transfer circuit 21*a*, the 20-bit pattern for the connection relation G1 from the transmission circuit 19*a* to the reception circuit 20*a*, the 2-bit pattern for the output line of the transfer circuit 21*b* from the transfer circuit 21*b* to the transfer circuit 21*a*, the 40-bit pattern for the connection relation G2 from the transmission circuit 19*b* to the reception circuit 20*b*, and the 60-bit pattern for the connection relation G3 from the transmission circuit 19*c* to the reception circuit 20*c* as viewed from the output circuit in the search test route in FIG. 4.

Figure 14:
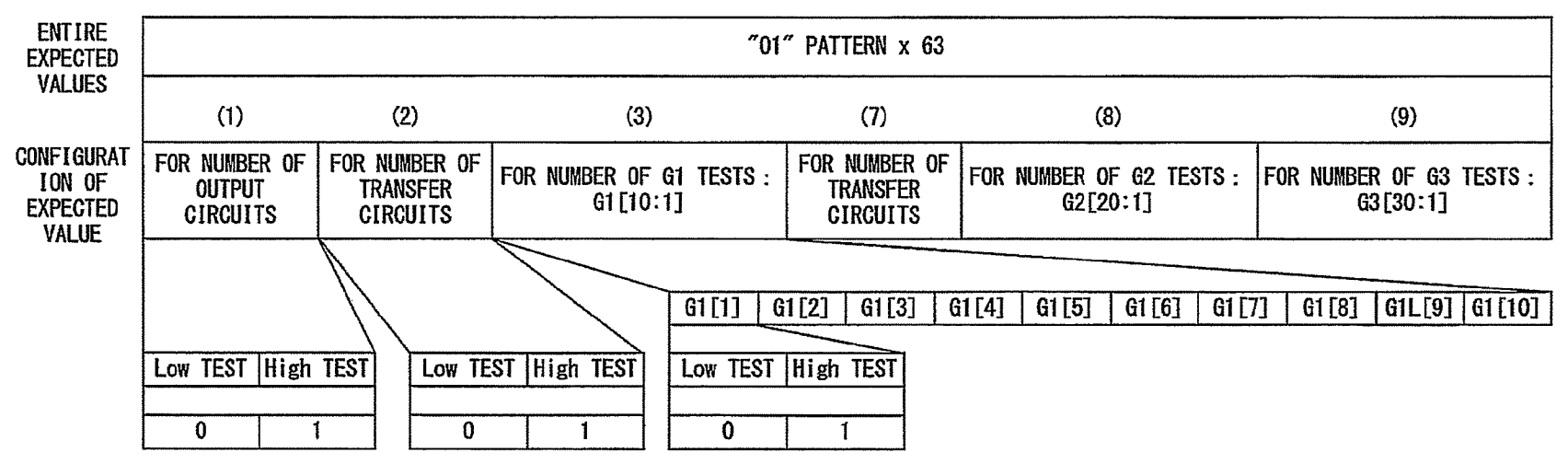

FIG. 14 is an explanatory view of the time arrangement of the expected value data pattern. The entire expected value is 63 "0, 1" 2-bit patterns for 2 cycles, but the time configuration includes the "0, 1" pattern for the output line of the output circuit 22 in FIG. 4, the "0, 1" pattern for the output line of the transfer circuit 21*a*, 10 "0, 1" patterns for the test of the connection relation G1, the output line of the transfer circuit 21*b*, that is, one "0, 1" pattern corresponding to the connection relation G4, 20 "0, 1" patterns for the connection relation G2, and 30 "0, 1" patterns for the connection relation G3. Each "0, 1" pattern indicates the connection relation when the low data "0" is provided and the connection relation when the high data "1" is provided for each line.

FIG. 15 is a time chart of the connection line test for the test circuit illustrated in FIG. 4. In FIG. 15, test data is first transmitted. First, the test data is transmitted. First, the output lines from the transmission circuit 19*a* illustrated in FIG. 4, that is, the ten lines of the G1, are transmitted sequentially from the first line as the transmission of test data. The output of the test data is performed by providing the pulse waveform as, for example, [1] of G1 at the rising of the clock. When the test data is completely output for the ten lines corresponding to the G1, the test data for the 20 lines of the connection relation G2 is transmitted, and finally the test data for the last 30 lines is transmitted, thereby terminating the transmission of the test data.

Afterwards, data is output from the output circuit 22. The first output 2-bit data pattern is the "0, 1" pattern for the output line of the output circuit 22, and the next 2-bit output is the "0, 1" pattern for the output line of the transfer circuit 21*a*, then the 2-bit data pattern is sequentially output for each of the lines of the connection relations G1, G2, and G3.

As illustrated in FIG. 14, after outputting 10 "0, 1" patterns for the connection relation G1, the 2-bit test result for the connection relation G4, that is the output line from the transfer circuit 21*b*, is output before outputting the test result of the line for the connection relation G2. In this example, the output pattern is described as "0, 1" by assuming that there is no defect in the connection lines. If there is a defect in a connection relation, the 2-bit pattern can be, for example, "0, 0" or "1, 1", and the position of the defective line can be designated by counting the number of cycles from the leading cycle of the start of the output. Furthermore, the test result for the output line of the transfer circuit 21*a* output after outputting the first test result for the output line of the output circuit 22 is a result for the connection line in the FPGA 1, and the result is unnecessary for the test of the connection line among the FPGAs according to the present invention.

FIG. 16 is a detailed flowchart of the defective line list output process performed using a test result. In FIG. 16, the process of outputting the defective line list 11 is performed using the expected value 7 and the test result 10 as illustrated with reference to FIG. 2. First, in step S61, the test result and the expected value are read, and the configuration information is read in step S62. The configuration information refers to the information about the configuration of the search test route indicated at the upper half of the expected value file illustrated in FIG. 13, and an output circuit is first read as the first configuration information.

Then, it is determined in step S63 whether or not the configuration information refers to a reception circuit. Since it is not a reception circuit in this example, the number N of lines corresponding to the configuration information is defined as "1" in step S65, and then control is passed to step S66. If it is a reception circuit in step S63, control is passed to step S66 after the number of input lines to the reception circuit, that is, the number of lines N corresponding to the connection relation, is read.

In step S66, the number L of times of the loop process from the next step S67 to step S72 is reset to "1", and the 2-bit expected value is read in step S67. The first read two bits are a 2-bit "0, 1" pattern for the output line of the output circuit, a corresponding test result, that is, the first 2-bit value, is read in step S68, it is determined in step S69 whether or not the 2-bit values match each other, and control is passed to step S71 after a line corresponding to a non-matching result is output to the defect list in step S70 or immediately when a matching result is detected.

It is determined in step S71 whether or not the number L of times of looping operations matches the number N of lines set in step S65 or read in step S64. If a non-matching result is output, then the value of L is incremented in step S72, and the processes in and after step S67 are repeated. In this example, comparison being performed for the test result of the first output circuit, the value of N is "1", control is immediately passed to step S73, and it is determined whether or not there is the next configuration information. In this example, since there is the information about a transfer circuit as the next configuration information, the configuration information is read in step S62, and the processes in and after step S63 are repeated.

When the subsequent processes are roughly described, the number N of lines is set to "1" for the configuration information about two transfer circuits, and the comparison is once made between a 2-bit expected value and a 2-bit test result. However, for the configuration information about the connection relation G1, it is determined to be a reception circuit in step S63, the value of N is set to 10 in step S64, the loop from step S67 to step S72 is repeated ten times, 10 continuous 2-bit expected value patterns and 2-bit test result patterns are sequentially compared, and the test result is compared with the expected value for the connection relation G2 and finally for the connection relation G3, and a expected value comparison result is output as the defective line list 11 in step S74.

According to the present embodiment as described above in detail, a connection test can be conducted using a line between devices regardless of the connection form between devices or the number of connection lines only by using a formatted and general-purpose circuit as a test circuit module and separately and independently operating each circuit.

What is claimed is:

1. An inter-device connection test circuit generating method, comprising:
   receiving input of data of a connection relation indicating devices mutually line-connected among a plurality of devices, a number of connection lines corresponding to respective connection relations, and a result output device outputting a test result; and
   generating a connection test circuit for a line between the devices corresponding to a line connection among the plurality of devices wherein
   connection destination devices are sequentially searched for corresponding to the connection line between the connection destination devices from an output terminal of the result output device, and a test route for a connection test is generated.

2. The method according to claim 1, wherein
the plurality of devices are programmable devices capable of changing a function by a program.

3. The method according to claim 1, wherein
a test circuit module corresponding to the test route is embedded in the plurality of devices to generate the connection test circuit.

4. The method according to claim 3, wherein
the test circuit module corresponds to the plurality of devices, and is realized in a programmable device whose function can be changed by a program.

5. The method according to claim 4, wherein
used as the test circuit module are an output circuit included in the result output device, a transmission circuit for outputting a test pattern data, a reception circuit for receiving a signal from the transmission circuit, and a transfer circuit for outputting from one signal line signals input from two circuits.

6. The method according to claim 5, wherein
the output circuit and the transfer circuit output test pattern data for testing an output line of the circuits before outputting input data.

7. The method according to claim 1, wherein
an expected value to be output from the result output device is generated corresponding to the transmitted test route and predetermined test pattern data.

8. The method according to claim 7, wherein
a test result output value output from the result output device is compared with the generated expected value corresponding to the predetermined test pattern data, and a defective line point is detected in a mutual line connection among the plurality of device.

9. The method according to claim 7, wherein
the predetermined test pattern data is "0" and "1" corresponding to each connection line among the devices, and the test pattern data is transmitted between devices in 2 cycles for one connection line.

10. An inter-device connection test circuit generation apparatus, comprising:
a test route search unit that receives input of data of a connection relation indicating devices mutually line-connected among a plurality of devices, a number of connection lines corresponding to respective connection relations, and a result output device outputting a test result, and searches for a test route for the connection line test;
a test circuit/expected value generation unit that embeds a formatted test circuit module on the retrieved test route, generates a connection test circuit, and generates an expected value as output pattern data expected when the connection line is in a normal condition for test pattern data used in the connection test circuit; and
a result comparison unit that compares comparing the generated expected value with a result of a test conducted on the generated connection test circuit, and designates a defective point in a line.

11. The apparatus according to claim 10, wherein
the plurality of devices are programmable devices capable of changing a function by a program.

12. The apparatus according to claim 11, wherein
the test circuit module is realized in a programmable device capable of changing a function by a program.

13. The apparatus according to claim 12, wherein
used as the test circuit module are an output circuit included in the result output device, a transmission circuit for outputting a test pattern data, a reception circuit for receiving a signal from the transmission circuit, and a transfer circuit for outputting from one signal line a signal input from two circuits.

14. A computer-readable portable storage medium, on which is stored a program for enabling a computer to execute an inter-device connection test circuit generating process, the program comprising:
a procedure of receiving input of data of a connection relation indicating devices mutually line-connected among a plurality of devices, a number of connection lines corresponding to respective connection relations, and a result output device outputting a test result;
a procedure of searching for a test route for the connection line test, embedding a formatted test circuit module in the retrieved test route, generating a connection test circuit, and outputting obtained data to memory;
a procedure of generating an expected value as output pattern data expected when the connection line is in a normal state corresponding to a test pattern data used in the connection test circuit, and storing obtained data in the memory;
a procedure of reading the expected value and a result of a test conducted on the generated connection test circuit from the memory; and
a procedure of comparing the test result with the expected value and designating a defective point in a line.

* * * * *